(12) United States Patent
  Kasai et al.

(10) Patent No.: US 12,588,151 B2
(45) Date of Patent: Mar. 24, 2026

(54) JOINT STRUCTURE

(71) Applicant: TDK Corporation, Tokyo (JP)

(72) Inventors: Ryohei Kasai, Tokyo (JP); Masaki Oikawa, Tokyo (JP); Susumu Taniguchi, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 424 days.

(21) Appl. No.: 18/024,383

(22) PCT Filed: Aug. 19, 2021

(86) PCT No.: PCT/JP2021/030439
  § 371 (c)(1),
  (2) Date: Mar. 2, 2023

(87) PCT Pub. No.: WO2022/050073
  PCT Pub. Date: Mar. 10, 2022

(65) Prior Publication Data
  US 2023/0262905 A1     Aug. 17, 2023

(30) Foreign Application Priority Data
  Sep. 4, 2020    (JP) ................................. 2020-148910

(51) Int. Cl.
  *H05K 3/34*       (2006.01)
(52) U.S. Cl.
  CPC .................................. *H05K 3/3463* (2013.01)
(58) Field of Classification Search
  CPC ......... H01L 21/52; H01L 21/60; H05K 1/181; H05K 2201/0112; H05K 3/3494; H05K 3/3463; H05K 3/285
  See application file for complete search history.

(56) References Cited

U.S. PATENT DOCUMENTS 5,829,125 A * 11/1998 Fujimoto ................ H01L 24/05
  219/121.64
2013/0234298 A1* 9/2013 Mitsugi .................. B23K 26/18
  257/629
(Continued)

FOREIGN PATENT DOCUMENTS

JP          H9-51016 A       2/1997
JP          2013-125764 A    6/2013
(Continued)

OTHER PUBLICATIONS

Mar. 7, 2023 International Preliminary Report on Patentability issued in International Patent Application No. PCT/JP2021/030439.

*Primary Examiner* — Walter L Lindsay, Jr.
(74) *Attorney, Agent, or Firm* — Oliff PLC

(57)          ABSTRACT

A joint structure, in which an electronic component and a wiring substrate are joined to each other, includes: a base material of the electronic component; a base material of the wiring substrate; and a joint portion that includes at least an electrode of the electronic component and an electrode of the wiring substrate, and that joins the base material of the electronic component and the base material of the wiring substrate. The joint portion includes a material having an absorption coefficient of $2 \times 10^5$ cm$^{-1}$ or more for light of a wavelength of 250 to 1000 nm. The base material of at least one component of the electronic component and the wiring substrate consists of a material having an absorption coefficient of $1.5 \times 10^5$ cm$^{-1}$ or less for the light of a wavelength of 250 to 1000 nm.

4 Claims, 3 Drawing Sheets

(56)             References Cited

U.S. PATENT DOCUMENTS

2015/0016066 A1\*  1/2015  Shimamura ..........  H05K 1/0216
                                                                          29/841
2019/0229085 A1\*  7/2019  Arutinov ...........  H01L 21/67115
2022/0020697 A1\*  1/2022  Nomura ...............  H01L 21/268

FOREIGN PATENT DOCUMENTS

JP          2013-239560  A      11/2013
JP          2019-528565  A      10/2019

\* cited by examiner (a)

(b)

(a)

(b)

JOINT STRUCTURE

TECHNICAL FIELD

The present disclosure relates to a joint structure.

BACKGROUND ART

In the related art, photonic thermal adhesion such as photonic soldering is known as a method for joining an electronic component and a wiring substrate. For example, a light pulse of high energy is generated from a light source for thermal adhesion of a thermal adhesive material such as a solder material disposed between the electronic component and the wiring substrate. The electronic component is suitable for absorbing energy exposed to a surface of the electronic component, and transferring the energy to a thermal adhesive material joint portion (for example, a solder joint portion) via the electronic component in the form of heat for photonic soldering. However, the electronic component is likely to be affected by high energy required for obtaining adhesion via the thermal adhesive material. Therefore, there is a possibility that the wiring substrate or the electronic component is damaged or degraded during a photonic adhesion process. On the other hand, in a method described in Patent Literature 1, damaging an electronic component and a wiring substrate has been resolved by instantaneously raising temperature to a temperature maintained lower than a damage temperature of the electronic component, and by performing preheating to a temperature lower than a damage temperature of the wiring substrate, via application of a light pulse to the electronic component.

CITATION LIST

Patent Literature

Patent Literature 1: Japanese Unexamined Patent Publication No. 2019-528565

SUMMARY OF INVENTION

Technical Problem

In the above-described method of Patent Literature 1, the light pulse is applied to the electronic component, light energy absorbed by the electronic component is converted into heat energy, and heat is conducted to a thermal adhesive material, so that the electronic component and the wiring substrate thermally adhere to each other. Here, since heat conductivity differs depending on the size of the electronic component, in some cases, the thermal adhesive material is not uniformly melted, and thermal adhesion between the electronic component and the wiring substrate cannot be obtained, which is a problem. On the other hand, when an output of the light pulse is increased to uniformly melt the thermal adhesive material, the electronic component is heated to a temperature higher than the damage temperature, and is damaged, which is a problem.

An object of the present disclosure is to provide a joint structure capable of improving joinability between an electronic component and a wiring substrate while suppressing damage to the electronic component and to the wiring substrate.

Solution to Problem

According to the present disclosure, there is provided a joint structure in which an electronic component and a wiring substrate are joined to each other, the structure including: a base material of the electronic component; a base material of the wiring substrate; and a joint portion that includes at least an electrode of the electronic component and an electrode of the wiring substrate, and that joins the base material of the electronic component and the base material of the wiring substrate. The joint portion includes a material having an absorption coefficient of $2\times10^5$ cm$^{-1}$ or more for light of a wavelength of 250 to 1000 nm. The base material of at least one component of the electronic component and the wiring substrate consists of a material having an absorption coefficient of $1.5\times10^5$ cm$^{-1}$ or less for the light of a wavelength of 250 to 1000 nm.

In the joint structure according to the present disclosure, the base material of at least one component of the electronic component and the wiring substrate consists of a material having an absorption coefficient of $1.5\times10^5$ cm$^{-1}$ or less for the light of a wavelength of 250 to 1000 nm. Therefore, in the case of performing irradiation with a light pulse from an at least one component side, the light pulse can transmit through the base material of the one component, and heat generated in the base material can also be suppressed. On the other hand, the joint portion includes a material having an absorption coefficient of $2\times10^5$ cm$^{-1}$ or more for the light of a wavelength of 250 to 1000 nm. Therefore, heat is generated in the joint portion by the light pulse that has transmitted through the base material of the one component. As described above, since the joint portion itself in which joining is performed generates heat, regardless of the sizes of the electronic component and the wiring substrate, joining can be performed in a state where a heat distribution in the joint portion is uniform. As described above, it is possible to improve joinability between the electronic component and the wiring substrate while suppressing damage to the electronic component and to the wiring substrate.

The electrode of the one component of the joint portion may contain at least one or more metals having an absorption coefficient of $2\times10^5$ cm$^{-1}$ or more for the light of a wavelength of 250 to 1000 nm. In this case, the electrode generates heat due to the transmitted light pulse.

The joint portion may include a thermal adhesive material that joins the electrode of the electronic component and the electrode of the wiring substrate. As a method for performing joining via the thermal adhesive material, one of a method for performing joining without applying a load and a method for performing joining while applying a load can be employed.

The thermal adhesive material may contain tin and bismuth. Since the thermal adhesive material contains bismuth having a low melting point, it is possible to perform joining at low temperature, it is possible to shorten a process time required for a process of heating to cooling in a joining step, and it is possible to reduce a temperature load applied to a product.

Advantageous Effects of Invention

According to the present disclosure, it is possible to provide the joint structure capable of improving joinability between the electronic component and the wiring substrate while suppressing damage to the electronic component and to the wiring substrate.

DESCRIPTION OF EMBODIMENTS

Figure 1:
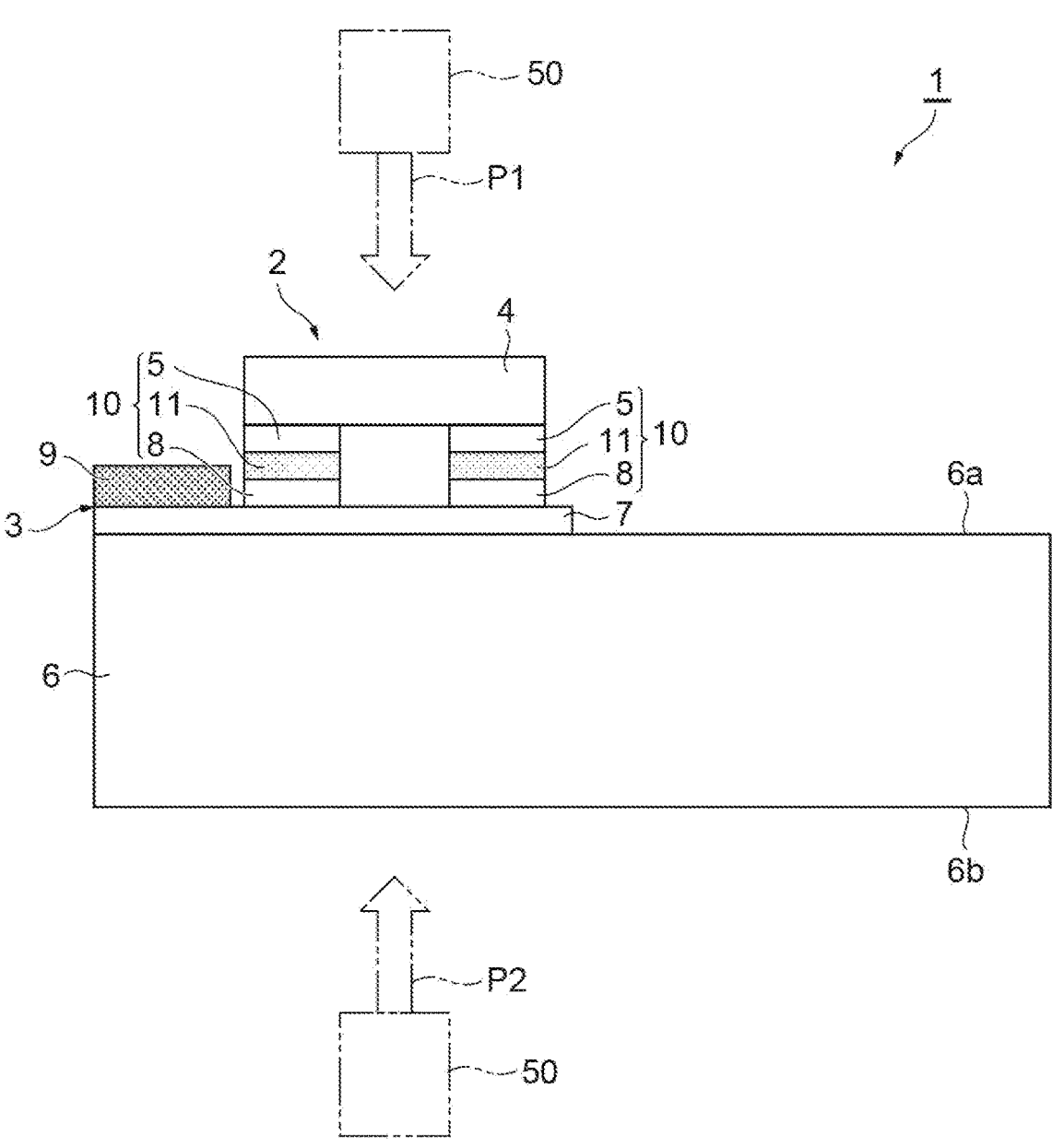
FIG. 1 is a schematic side view showing a joint structure 1 according to an embodiment of the present disclosure.

A joint structure according to an embodiment of the present disclosure will be described with reference to FIG. 1. FIG. 1 is a schematic side view showing a joint structure 1 according to the embodiment of the present disclosure. As shown in FIG. 1, the joint structure 1 is a structure in which an electronic component 2 and a wiring substrate 3 are joined to each other. In the present embodiment, the joint structure 1 will be described as being applied to the joining of a light-emitting device of a display product.

The electronic component 2 includes a base material 4 and an electrode 5. The base material 4 is a body portion of the electronic component 2, and is a member that performs the function of the electronic component 2. The electrode 5 is a metal portion formed on a main surface of the base material 4. In the present embodiment, the electronic component 2 is formed of a light-emitting device. The light-emitting device is a component that emits light according to an input from the wiring substrate 3.

The wiring substrate 3 includes a base material 6, a wiring layer 7, an electrode 8, and a light-absorbing layer 9. The base material 6 is a flat plate-shaped body portion of the wiring substrate 3. The base material 6 has a first main surface 6a on which the electronic component 2 is mounted, and a second main surface 6b on a back side. The wiring layer 7 is a metal layer forming a wiring pattern formed on the first main surface 6a of the base material 6. The electrode 8 is a metal portion formed in an upper layer of the wiring layer 7 on the first main surface 6a.

The light-absorbing layer 9 is a layer formed in an upper layer of the wiring layer 7 on the first main surface 6a of the base material 6. In a plan view, the light-absorbing layer 9 is formed on the wiring layer 7 at a location where the electronic component 2 is not provided. The light-absorbing layer 9 consists of a material having an average transmittance of 1 to 30% for light of a wavelength of 425 to 800 nm. Accordingly, the light-absorbing layer 9 can absorb visible light. The visibility of a wiring having a high reflectance can be suppressed by providing the light-absorbing layer 9, so that the function of the display product can be improved. Further, the light-absorbing layer 9 may contain polyimide resin. As described above, since the light-absorbing layer 9 contains polyimide resin that is highly heat-resistant, in a heating process when the electronic component 2 which is a light-emitting device is joined, the electronic component 2 can be joined to the wiring substrate 3 without being damaged. In addition, the light-absorbing layer 9 may contain chromium. In this case, since the light-absorbing layer 9 contains an inorganic material that is highly heat-resistant, particularly, chromium having a high light-shielding property, in the heating process when the electronic component 2 which is a light-emitting device is joined, the electronic component 2 can be joined to the wiring substrate 3 without being damaged.

The base material 4 of the electronic component 2 and the base material 6 of the wiring substrate 3 are joined to each other by a joint portion 10. The joint portion 10 includes at least the electrode 5 of the electronic component 2 and the electrode 8 of the wiring substrate 3. Further, in the present embodiment, the joint portion 10 includes a thermal adhesive material 11 that joins the electrode 5 of the electronic component 2 and the electrode 8 of the wiring substrate 3. The thermal adhesive material 11 joins the electrode 5 and the electrode 8 by being melted via application of heat, and then by being cooled and solidified. The thermal adhesive material 11 may contain, for example, tin and bismuth.

In the joint structure 1, the electronic component 2 and the wiring substrate 3 are joined to each other using heat generated by irradiation with light pulses P1 and P2 from a light source 50. The joint structure 1 may be irradiated with the light pulse P1 from a first main surface 6a side (namely, electronic component 2 side), may be irradiated with the light pulse P2 from a second main surface 6b side, or may be irradiated with both the light pulses P1 and P2. The light pulses P1 and P2 are set to apply energy to any member of the joint portion 10 in order to heat the member. The light pulses P1 and P2 are light of a wavelength of 250 to 1000 nm.

The case of performing irradiation with the light pulse P1 will be described. In this case, the base material 4 of the electronic component 2 is transparent. The base material 4 of the electronic component 2 consists of a material having an absorption coefficient of $1.5 \times 10^5 \text{ cm}^{-1}$ or less for light of a wavelength of 250 to 1000 nm. Examples of such a material include materials including glass, gallium nitride, gallium arsenide, aluminum nitride, silicon carbide, and the like. Therefore, the light pulse P1 suppresses energy to be applied to the base material 4, to a low level by transmitting through the base material 4 of the electronic component 2. On the other hand, the joint portion 10 includes a material having an absorption coefficient of $2 \times 10^5 \text{ cm}^{-1}$ or more for light of a wavelength of 250 to 1000 nm. Specifically, the electrode 5 of the electronic component 2 of the joint portion 10 contains at least one or more metals having an absorption coefficient of $2 \times 10^5 \text{ cm}^{-1}$ or more for the light of a wavelength of 250 to 1000 nm. Examples of such metals include metals such as copper, chromium, titanium, gold, tin, bismuth, nickel, palladium, and alloys thereof. Therefore, the light pulse P1 that has transmitted through the base material 4 applies energy to the electrode 5 to generate heat in the electrode 5 and to heat the thermal adhesive material with the heat.

The case of performing irradiation with the light pulse P2 will be described. In this case, the base material 6 of the wiring substrate 3 is transparent. The base material 6 of the wiring substrate 3 consists of a material having an absorption coefficient of $1.5 \times 10^5 \text{ cm}^{-1}$ or less for light of a wavelength of 250 to 1000 nm. Examples of such a material include materials including glass, gallium nitride, gallium arsenide, silicon carbide, aluminum nitride, silicon carbide, polyethylene terephthalate, polyethylene naphthalate, polyimide, and the like. Therefore, the light pulse P2 suppresses energy to be applied to the base material 6, to a low level by transmitting through the base material 6 of the wiring substrate 3. On the other hand, the joint portion 10 includes a material having an absorption coefficient of $2 \times 10^5 \text{ cm}^{-1}$ or more for light of a wavelength of 250 to 1000 nm. Specifically, the electrode 8 of the wiring substrate 3 of the joint portion 10 contains at least one or more metals having an absorption coefficient of $2 \times 10^5 \text{ cm}^{-1}$ or more for the light of a wavelength of 250 to 1000 nm. Examples of such metals include the same metals as those for the electrode 5 of the electronic component 2. Therefore, the light pulse P2 that has transmitted through the base material 6 applies energy to the electrode 8 to generate heat in the electrode 8 and to heat the thermal adhesive material with the heat.

Figure 2:
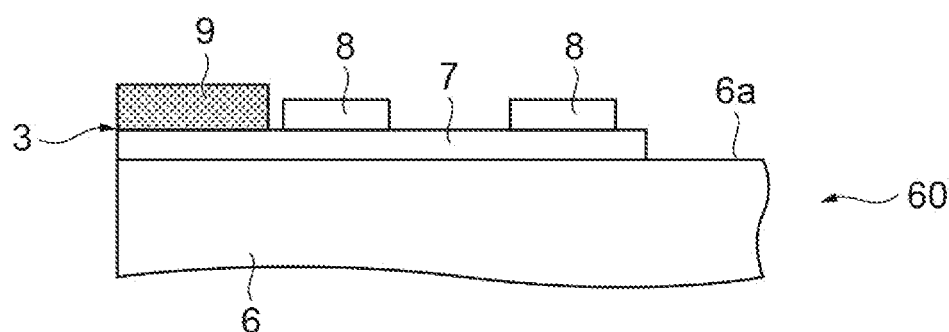
FIGS. 2(a) and 2(b) are schematic side views showing a state in each step of a method for manufacturing the joint structure.
Figure 2:
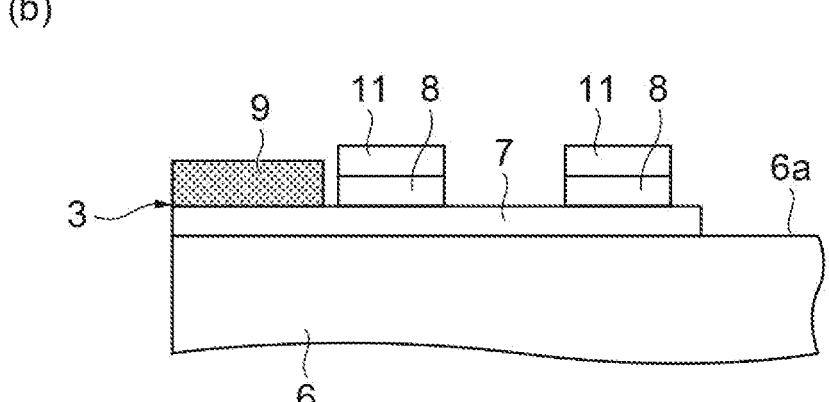
Figure 3:
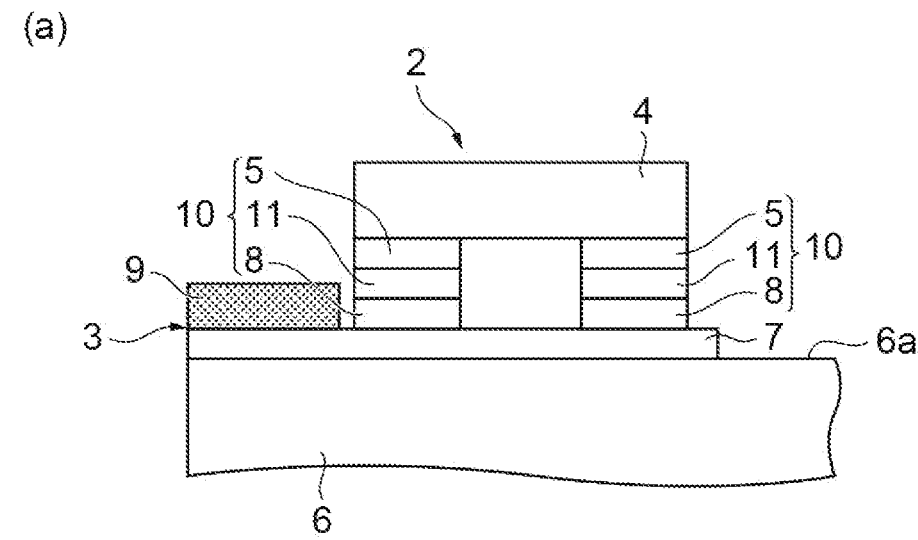
FIGS. 3(a) and 3(b) are schematic side views showing a state in each step of the method for manufacturing the joint structure.
Figure 3:
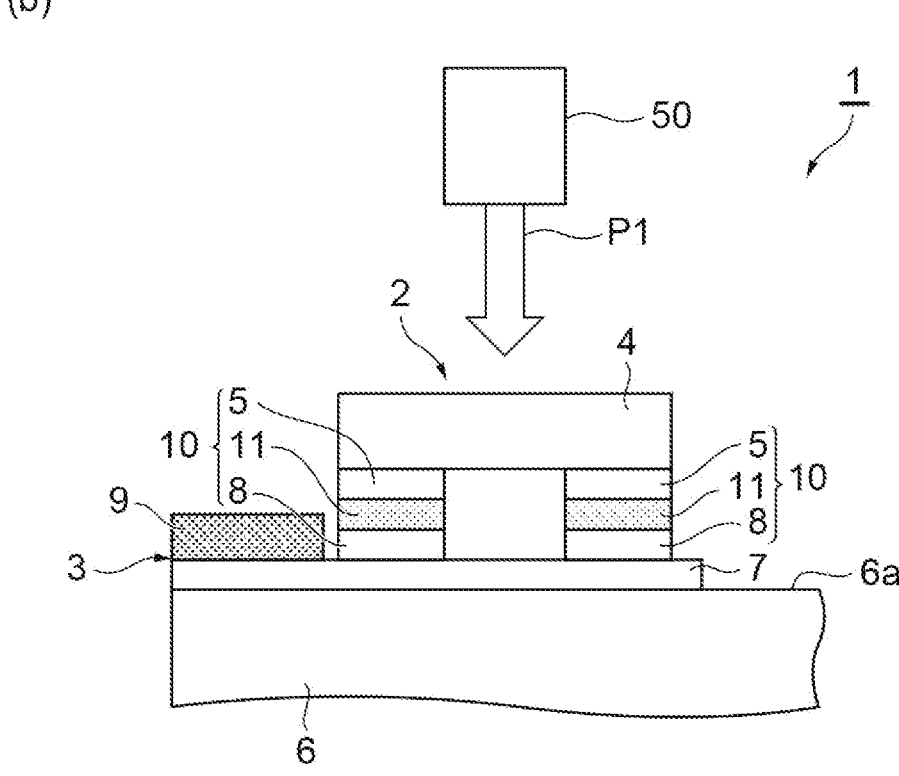

Next, one example of a method for manufacturing the joint structure 1 will be described with reference to FIGS. 2 and 3. FIGS. 2 and 3 are schematic side views showing a state in each step of the method for manufacturing the joint structure 1. In the method for manufacturing the joint structure 1, first, a preparation step of preparing the electronic component 2 and the wiring substrate 3 is executed. Next, as shown in FIG. 2(a), a disposition step of disposing the wiring substrate 3 on a disposition unit 60 for performing joining work is executed. Next, as shown in FIG. 2(b), a thermal adhesive material application step of applying the thermal adhesive material 11 onto the electrode 8 of the wiring substrate 3 is executed. Incidentally, after the thermal adhesive material application step, a flux having a reducing action on the thermal adhesive material 11 may be applied.

Next, as shown in FIG. 3(a), a mounting step of mounting the electronic component 2 on the wiring substrate 3 by disposing the electrode 5 on the electrode 8 of the wiring substrate 3 via the thermal adhesive material 11 is executed. Next, as shown in FIG. 3(b), a joining step of performing joining by causing the light source 50 to irradiate the joint structure 1 with the light pulse P1 from above the electronic component 2 is executed. Accordingly, the electrode 5 generates heat due to the light pulse P1 that has transmitted through the base material 4, and the thermal adhesive material 11 is heated by the heat. Then, the melted thermal adhesive material 11 is cooled and solidified, so that the electrode 5 of the electronic component 2 is joined to the electrode 8 of the wiring substrate 3 via the thermal adhesive material 11. Accordingly, the electronic component 2 and the wiring substrate 3 are joined to each other. Incidentally, FIG. 3(b) shows an example of the case of performing irradiation with the light pulse P1 from the first main surface 6a side, but as described with reference to FIG. 1, irradiation with the light pulse P2 from the second main surface 6b side may be performed.

When the base material 6 of the wiring substrate 3 consists of a material having an absorption coefficient greater than $1.5 \times 10^5$ cm$^{-1}$ for light of a wavelength of 250 to 1000 nm, or when the electrode 8 of the wiring substrate 3 has an absorption coefficient less than $2 \times 10^5 5^{-1}$ cm for light of a wavelength of 250 to 1000 nm, an interface between the wiring layer 7 and the base material 6 also becomes hot due to heat during heating. When the heat resistance of the base material 6 is low, there is a possibility that the product is damaged. Therefore, it is preferable that the absorption coefficients of each member are implemented according to the above-described ranges.

Next, actions and effects of the joint structure 1 according to the present embodiment will be described.

In the joint structure 1 according to the present embodiment, in the case of performing irradiation with the light pulse P1 from the electronic component 2 side, the base material 4 of the electronic component 2 is transparent. In addition, the base material 4 of the electronic component 2 consists of a material having an absorption coefficient of $1.5 \times 10^5$ cm$^{-1}$ or less for light of a wavelength of 250 to 1000 nm. Therefore, in the case of performing irradiation with the light pulse P1 from the electronic component 2 side, the light pulse P1 can transmit through the base material 4 of the electronic component 2, and heat generated in the base material 4 can also be suppressed. On the other hand, the joint portion 10 includes a material having an absorption coefficient of $2 \times 10^5$ cm$^{-1}$ or more for light of a wavelength of 250 to 1000 nm. Therefore, heat is generated in the joint portion 10 by the light pulse P1 that has transmitted through the base material 4 of the electronic component 2. As described above, since the joint portion 10 itself in which joining is performed generates heat, regardless of the sizes of the electronic component 2 and the wiring substrate 3, joining can be performed in a state where a heat distribution in the joint portion 10 is uniform. As described above, it is possible to improve joinability between the electronic component 2 and the wiring substrate 3 while suppressing damage to the electronic component 2 and to the wiring substrate 3.

The electrode 5 of the electronic component 2 of the joint portion 10 may contain at least one or more metals having an absorption coefficient of $2 \times 10^5$ cm$^{-1}$ or more for the light of a wavelength of 250 to 1000 nm. In this case, the electrode 5 generates heat due to the transmitted light pulse P1.

In addition, in the joint structure 1 according to the present embodiment, in the case of performing irradiation with the light pulse P2 from a wiring substrate 3 side, the base material 6 of the wiring substrate 3 is transparent. In addition, the base material 6 of the wiring substrate 3 consists of a material having an absorption coefficient of $1.5 \times 10^5$ cm$^{-1}$ or less for light of a wavelength of 250 to 1000 nm. Therefore, in the case of performing irradiation with the light pulse P2 from the wiring substrate 3 side, the light pulse P2 can transmit through the base material 6 of the wiring substrate 3, and heat generated in the base material 6 can also be suppressed. On the other hand, the joint portion 10 includes a material having an absorption coefficient of $2 \times 10^5$ cm$^{-1}$ or more for light of a wavelength of 250 to 1000 nm. Therefore, heat is generated in the joint portion 10 by the light pulse P2 that has transmitted through the base material 6 of the wiring substrate 3. As described above, since the joint portion 10 itself in which joining is performed generates heat, regardless of the sizes of the electronic component 2 and the wiring substrate 3, joining can be performed in a state where a heat distribution in the joint portion 10 is uniform. As described above, it is possible to improve joinability between the electronic component 2 and the wiring substrate 3 while suppressing damage to the electronic component 2 and to the wiring substrate 3.

The electrode 5 of the wiring substrate 3 of the joint portion 10 may contain at least one or more metals having an absorption coefficient of $2 \times 10^5$ cm$^{-1}$ or more for the light of a wavelength of 250 to 1000 nm. In this case, the electrode 5 generates heat due to the transmitted light pulse P1.

The joint portion 10 may include the thermal adhesive material 11 that joins the electrode 5 of the electronic component 2 and the electrode 8 of the wiring substrate 3. As the method for performing joining via the thermal adhesive material 11, one of a method for performing joining without applying a load and a method for performing joining while applying a load can be employed. In the present embodiment, at least one of the base material 4 of the electronic component 2 and the base material 6 of the wiring substrate 3 is transparent. In many cases, the transparent member is made of a material that is likely to crack, and when a load is applied to a structure including such a material, there is a possibility that a crack occurs in the base materials 4 and 6. For this reason, when the joint structure 1 according to the present embodiment is manufactured, in the method for performing joining without applying a load, cracking of the base materials 4 and 6 can be suppressed. On the other hand, in the method for performing joining while applying a load, when irradiation with a light pulse is performed, a load is applied to the extent that a crack does not occur in the base materials 4 and 6, using a plate to which a soft release film is attached, as a pressing member. The load is applied by pressing the base materials 4 and 6 while adjusting a pressing force with the pressing member. In this case, it is preferable that the pressing member is made of a material that does not interfere with transmission of the light pulse. As described above, the method in which a load is applied can suppress misalignment during joining while suppressing damage to the base materials 4 and 6, and can improve productivity compared to the method in which a load is not applied.

The thermal adhesive material 11 may contain tin and bismuth. Since the thermal adhesive material 11 contains bismuth having a low melting point, it is possible to perform joining at low temperature, it is possible to shorten a process time required for a process of heating to cooling in the joining step, and it is possible to reduce a temperature load applied to the product.

In addition, the joint structure 1 according to the present embodiment is applied to the display product. In this case, even when the light-emitting device is turned off, the visibility of the wiring layer 7 can be increased due to a high reflectance of a metal such as copper of the wiring layer 7 on the surface of the base material 6, but since the joint structure 1 includes the light-absorbing layer 9, the visibility of the wiring layer 7 can be suppressed, so that the function of the display device can be sufficiently performed.

The present disclosure is not limited to the above-described embodiment.

For example, in the above-described embodiment, at least one of the electrodes 5 and 8 generates heat due to energy from the light pulses P1 and P2. Instead thereof or in addition thereto, the thermal adhesive material 11 itself may generate heat by being subjected to energy from the light pulses P1 and P2.

In the above-described embodiment, the joint structure of the present disclosure is applied to the display device. However, the joint structure of the present disclosure may be applied to devices other than the display device, and may be applied to, for example, devices such as a solar cell module, a semiconductor component mounting module, and a sensor mounting module.

According to one aspect, there is provided a joint structure in which an electronic component and a wiring substrate are joined to each other, the structure including: a base material of the electronic component; a base material of the wiring substrate; and a joint portion that includes at least an electrode of the electronic component and an electrode of the wiring substrate, and that joins the base material of the electronic component and the base material of the wiring substrate. The base material of at least one component of the electronic component and the wiring substrate is transparent. The joint portion includes a material having an absorption coefficient of $2{\times}10^{\wedge}5$ cm$^{-1}$ or more for light of a wavelength of 250 to 1000 nm. The base material of the one component consists of a material having an absorption coefficient of $1.5{\times}10^{\wedge}5$ cm$^{-1}$ or less for the light of a wavelength of 250 to 1000 nm.

REFERENCE SIGNS LIST

1: joint structure, 2: electronic component, 3: wiring substrate, 4: base material (base material of electronic component), 5: electrode (electrode of electronic component), 6: base material (base material of wiring substrate), 8: electrode (electrode of wiring substrate), 10: joint portion, 11: thermal adhesive material.

The invention claimed is:

1. A joint structure in which an electronic component and a wiring substrate are joined to each other, the structure comprising:

a base material of the electronic component;

a base material of the wiring substrate; and a joint portion that includes at least an electrode of the electronic component and an electrode of the wiring substrate, and that joins the base material of the electronic component and the base material of the wiring substrate, wherein the joint portion includes a material having an absorption coefficient of $2{\times}10^{\wedge}5$ cm$^{-1}$ or more for light of a wavelength of 250 to 1000 nm, and the base material of the electronic component consists of a material having an absorption coefficient of $1.5{\times}10^{\wedge}5$ cm$^{-1}$ or less for the light of a wavelength of 250 to 1000 nm.

2. The joint structure according to claim 1, wherein the electrode of the electronic component of the joint portion contains at least one or more metals having an absorption coefficient of $2{\times}10^{\wedge}5$ cm$^{-1}$ or more for the light of a wavelength of 250 to 1000 nm.

3. The joint structure according to claim 1, wherein the joint portion includes a thermal adhesive material that joins the electrode of the electronic component and the electrode of the wiring substrate.

4. The joint structure according to claim 3, wherein the thermal adhesive material contains tin and bismuth.

* * * * *